United States Patent [19]
Miyama et al.

[11] Patent Number: 5,574,991
[45] Date of Patent: Nov. 12, 1996

[54] TRANSMISSION POWER CONTROL CIRCUIT

[75] Inventors: Keisei Miyama; Hideyo Ono, both of Hyogo, Japan

[73] Assignee: Mitsubishi Denki Kabushiki Kaisha, Tokyo, Japan

[21] Appl. No.: 900,759

[22] Filed: Jun. 19, 1992

Related U.S. Application Data

[63] Continuation of Ser. No. 328,245, Mar. 24, 1989, abandoned.

[30] Foreign Application Priority Data

Jun. 15, 1988 [JP] Japan ................................. 63-145652

[51] Int. Cl.[6] ................................................. H04B 1/04
[52] U.S. Cl. ........................................... 455/126; 455/127
[58] Field of Search ................................. 455/115, 116, 455/126, 127, 217, 343; 330/127, 129, 133, 134, 265, 279

[56] References Cited

U.S. PATENT DOCUMENTS

| | | | |
|---|---|---|---|
| 4,317,083 | 2/1982 | Boyd | 330/296 |
| 4,439,744 | 3/1984 | Kumar et al. | 330/285 |
| 4,485,349 | 11/1984 | Shegel et al. | 330/3 |
| 4,500,848 | 2/1985 | Marchand et al. | 330/285 |
| 4,523,155 | 6/1985 | Walczak et al. | 330/279 |
| 4,602,218 | 7/1986 | Vilmur et al. | 330/279 |
| 4,724,398 | 2/1988 | Yokoyama | 330/278 |
| 4,760,347 | 7/1988 | Li et al. | 330/127 |
| 4,873,493 | 10/1989 | Fujiwara | 330/285 |
| 4,935,705 | 6/1990 | Estanislao et al. | 330/296 |

FOREIGN PATENT DOCUMENTS

| | | | |
|---|---|---|---|
| 0225732 | 12/1983 | Japan | 455/127 |
| 0077205 | 4/1988 | Japan | 330/127 |
| 0109828 | 4/1989 | Japan | 455/127 |

*Primary Examiner*—Chi H. Pham

[57] ABSTRACT

In a transmission power control circuit which performs power amplification of a transmission signal to one of several predetermined levels in response to a control signal and outputs the amplified signal, bias voltage of the power amplifier circuit is set to the optimum in response to the output power of multiple levels, respectively. Since the bias voltage is set to the optimum, the power loss in the power amplifier circuit is decreased and the efficiency of the power amplifier circuit is improved.

15 Claims, 8 Drawing Sheets

TRANSMISSION POWER CONTROL CIRCUIT

This application is a continuation of application Ser. No. 07/328,245 filed on Mar. 24, 1989, now abandoned.

BACKGROUND OF THE INVENTION

1. Field of the Invention

The present invention relates to a transmission power control circuit which is used, for example, for the final stage or driver in a mobile communication transceiver.

2. Description of the Prior Art

FIG. 1 is a circuit diagram of a transmission power control circuit used as a transmission stage of a mobile communication transceiver as known in the prior art. In FIG. 1, numeral 1 designates an RF power module which amplifies and outputs transmission signal TX, numeral 2 designates a detection circuit which detects the output of the RF power module 1, and numeral 3 designates a multiplexer which selects, for example, one of six level-setting steps in 4 dB per step in response to a control signal 3a.

Numeral 4a designates a DC amplifier which amplifies output signals of the detection circuit 2, numeral 4b designates a DC amplifier which amplifies output signals of the multiplexer 3, numeral 4c designates a DC amplifier which supplies the multiplexer 3 with a reference input voltage, numeral 5 designates a current controlled differential amplifier which is composed of transistors 5a, 5b fed the outputs of the DC amplifiers 4a, 4b and numeral 6 designates a power control transistor which inputs a power source bias voltage (+6 V, for example) from a terminal 7 in accordance with output of the current control differential amplifier 5 and outputs a voltage of prescribed level to the RF power module 1.

Numeral 10 designates a terminal for transmission of an ON/OFF signal applied to the bases of transistors 11a, 11b. The emitter of each of transistors 11a, 11b is connected to a negative power source of −5 V, for example, through a terminal 13.

FIG. 2 is a circuit diagram showing an example of circuit constitution of the RF power module 1 using FETs. Also FIG. 3 is a circuit diagram of the multiplexer 13 showing the inner constitution of the C-MOS IC having a multiplexer function. The C-MOS IC is provided with three control signal terminals, three output terminals and six input terminals, but three of the six input terminals are only used in this case. In operation each input signal at input terminals corresponding to control signals 3a is switched so as to output the respective output terminals.

The operation of the transmission control circuit of FIGS. 1 to 3 will now be described. Transmission signal TX is inputted to the RF power module 1 and amplified and outputted as transmission output (TX OUT). (TX OUT) is also detected with respect to high frequency signal portions by the detection circuit 2, and is further rectified, smoothed, and transmitted to the DC amplifier 4a as a DC signal corresponding to the output of RF power module 1.

On the other hand, transmission ON/OFF signal from terminal 10 is applied to the bases of the transistors 11a, 11b, and the transistor 11a is turned on by ON-signal of the transmission ON/OFF signal from terminal 10 and the emitters of the transistors 5a, 5b become the potential of −5 V thereby the current control differential amplifier 5 is biased into an active state.

The multiplexer 3 selects a reference input voltage in by the combination applied to the three input terminals corresponding to one of six steps of the encoded control signals 3a, and sends outputs to the three output terminals. These combined outputs are converted together via resistors having different resistance values connected to the output terminals of the multiplexer 3 into an output control signal for one of six level steps, and supplied to an inverting input terminal of the DC amplifier 4b. The output control signal is amplified by the DC amplifier 4b and becomes one input of the differential amplifier 5. Outputs of both DC amplifiers 4a, 4b are amplified in differential by the current control differential amplifier 5, and applied to the base of the power control transistor 6.

Thereby the power control transistor 6 controls the voltage supplied to the RF power module 1, and performs stabilization of the transmission power and the transmission power control of six steps in 4 dB per step up to the maximum transmission power.

As shown in FIG. 2, in the RF power module 1 using FETs, voltage applied to drain voltage terminals D1, D2 is controlled in six steps corresponding to the output of the differential amplifier 5.

FIG. 4 is an operating characteristic diagram showing the $I_D$–$V_{GS}$ characteristics of the FET. As shown in FIG. 4, if the operating point is set to the pinch-off voltage $V_P$, prescribed output cannot be obtained. Consequently, in order to obtain the prescribed output without using an FET of large output, the FET is usually used in the state that the operating point is set higher than the pinch-off voltage $V_P$. In this case, however, even if voltage is not applied to gate, drain current flows as idle current. When the power control is performed, ratio of the idle current versus drain current corresponding to the output power becomes large thereby efficiency of the RF power module 1 becomes low. That is, even if the efficiency is optimum at a certain step of the stepwise level control, it may be lowered significantly at other steps.

SUMMARY OF THE INVENTION

An object of the invention is in that the gate bias voltage of the RF power module is varied in response to the transmission power and thereby the ratio of the idle current is optimized and the efficiency of the RF power module is improved.

In a transmission power control circuit according to the invention, a gate bias voltage control circuit is installed which outputs gate bias voltage to an RF power module in response to the output of a multiplexer to perform level setting of stepwise control.

The gate bias voltage control circuit in the invention controls the operating point of the RF power module in response to the output of the multiplexer. Thereby the idle current of the RF power module is optimized and the efficiency of the RF power module is improved.

DESCRIPTION OF THE PREFERRED EMBODIMENTS

An embodiment of the invention will now be described referring to the accompanying drawings.

Figure 1:
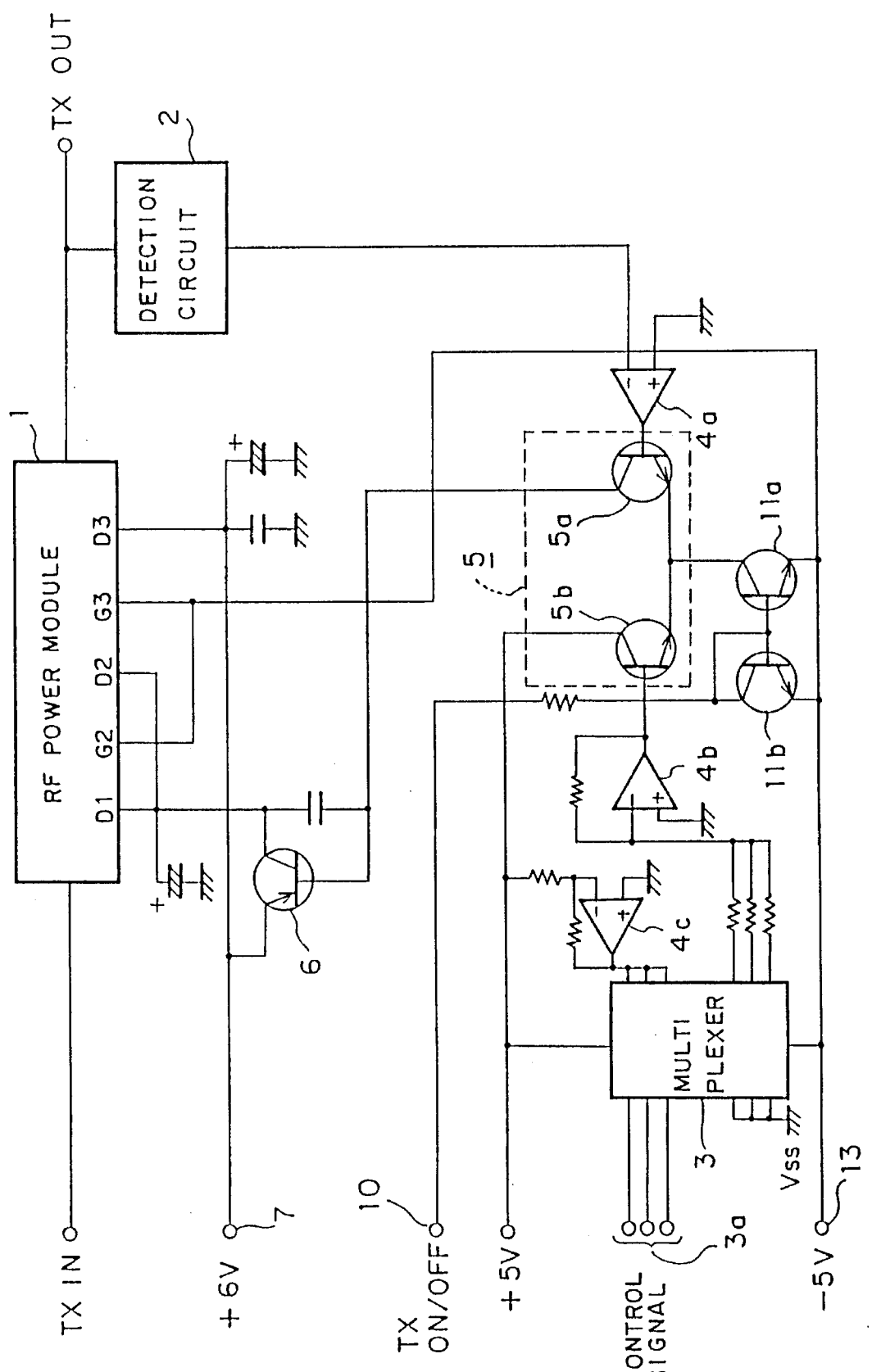
FIG. 1 is a circuit diagram showing a transmission power control circuit according to the prior art.
Figure 2:
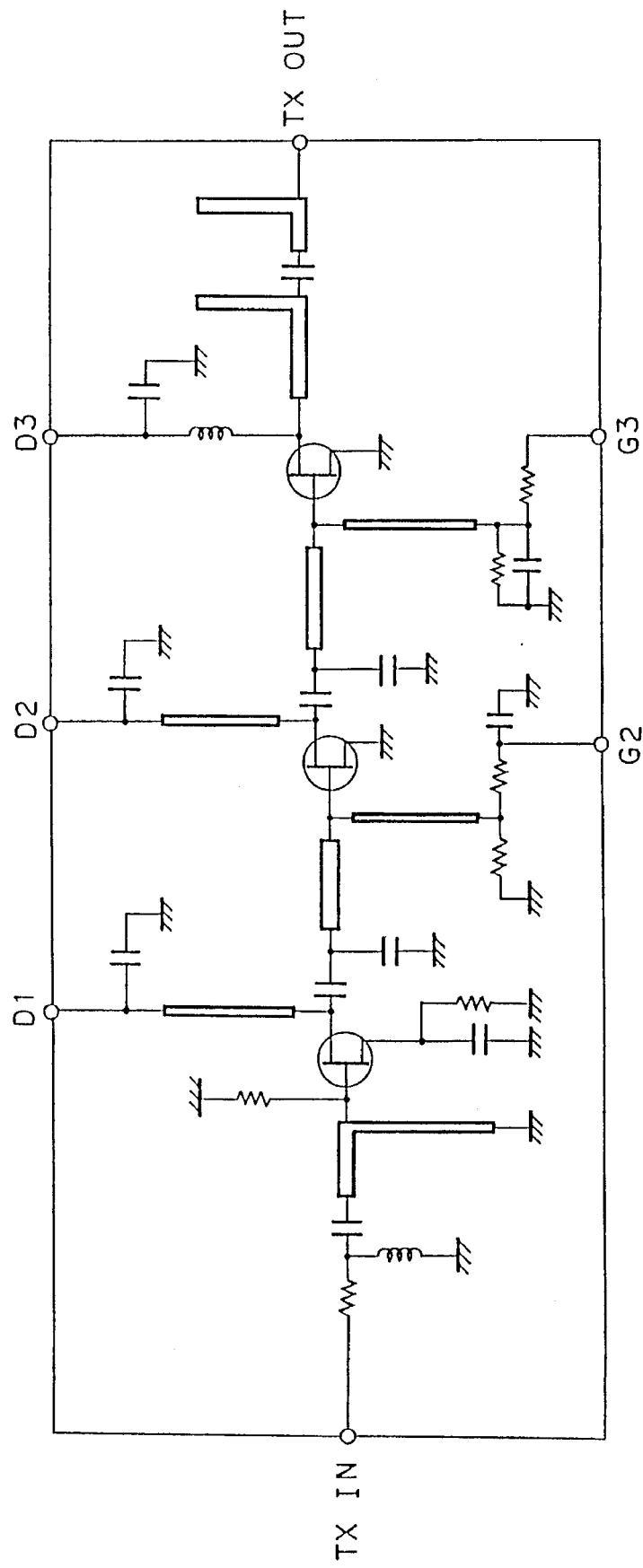
FIG. 2 is a circuit diagram showing an example of an RF power module.
Figure 3:
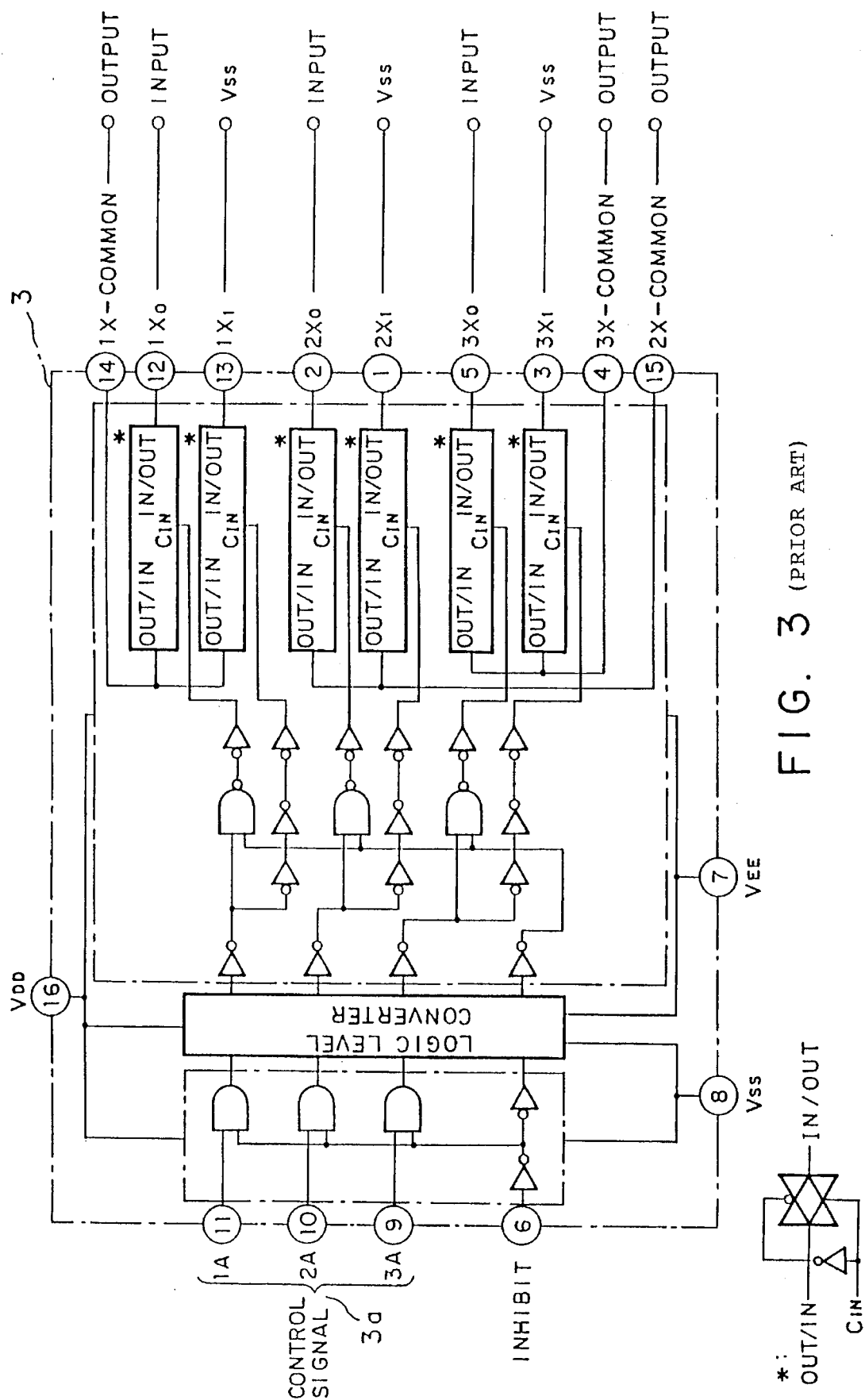
FIG. 3 is a circuit diagram showing the inner constitution of a C-MOS IC for performing multiplexer function.
Figure 4:
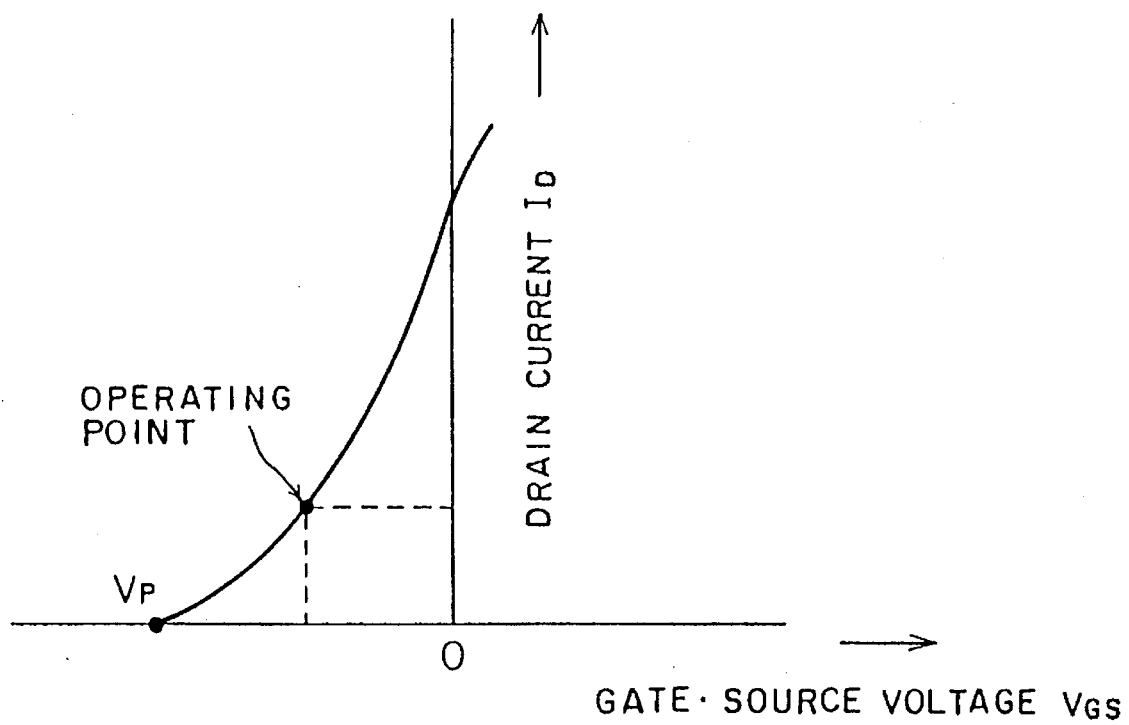
FIG. 4 is a characteristic diagram showing the $I_D$–$V_{GS}$ characteristic of a FET.
Figure 5:
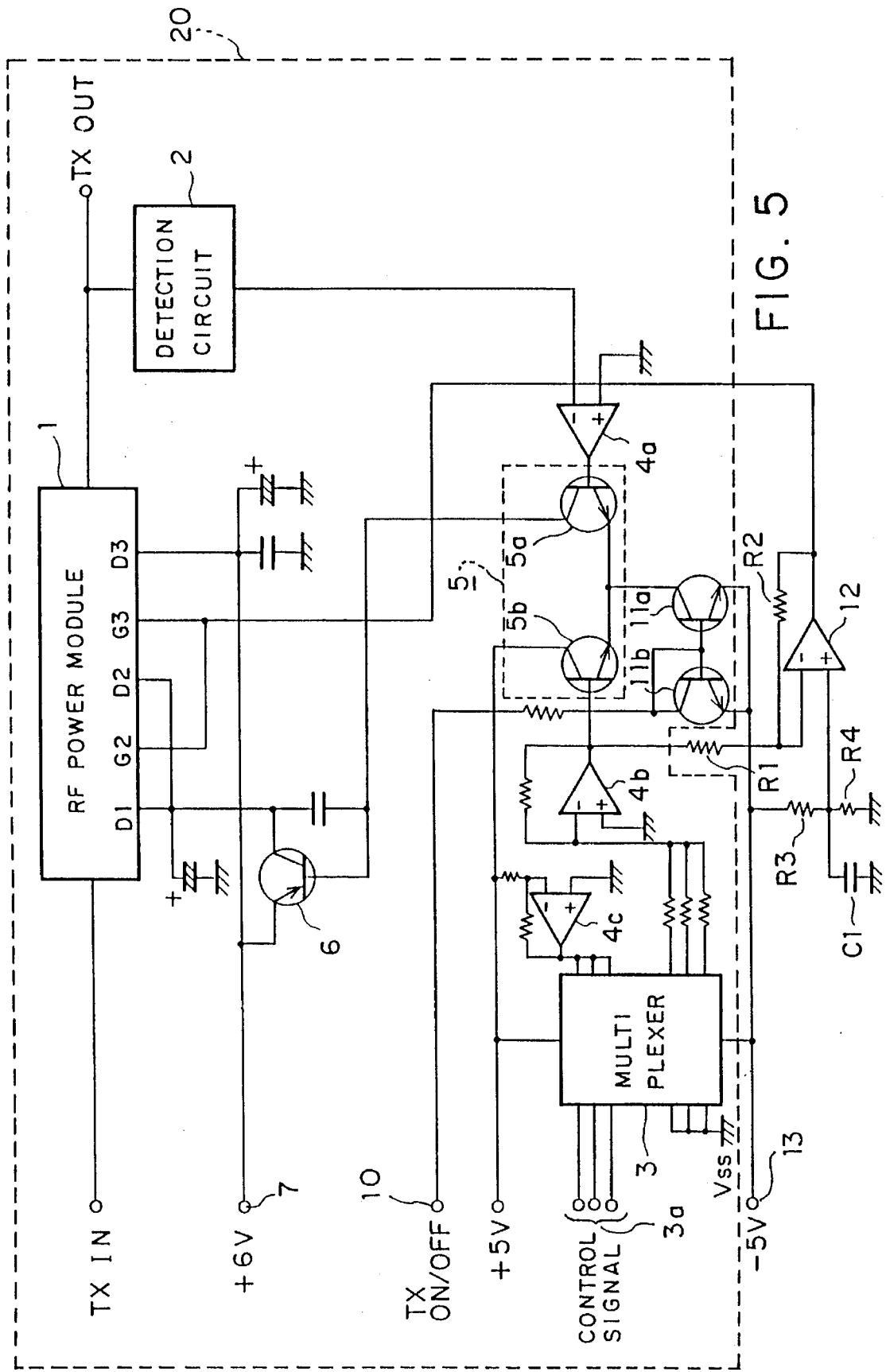
FIG. 5 is a circuit diagram showing a transmission power control circuit as an embodiment of the present invention.

In FIG. 5, numerals 1–11b designate the same parts as those shown in FIG. 1. Numeral 12 designates a main element of a gate bias voltage control circuit which inputs the output of a multiplexer 3 through a DC amplifier 4b and a negative power source (–5 V) from terminal 13, and controls the gate bias voltage of an RF power module 1. An operational amplifier is used in this embodiment for element 12.

Numeral R1 designates an input resistor which is inserted between an inverting input terminal of the operational amplifier 12 and the output terminal of DC amplifier 4b, numeral R2 designates a feedback resistor which is connected to the inverting input terminal and the output terminal of the operational amplifier 12, numerals R3, R4 designate resistors which are connected between the negative power source (–5 V) from terminal 13 and ground, and apply a reference voltage from the junction thereof to the non-inverting input terminal of the operational amplifier, and numeral C1 designates a capacitor which is connected in parallel to the resistor R4.

Figure 6:
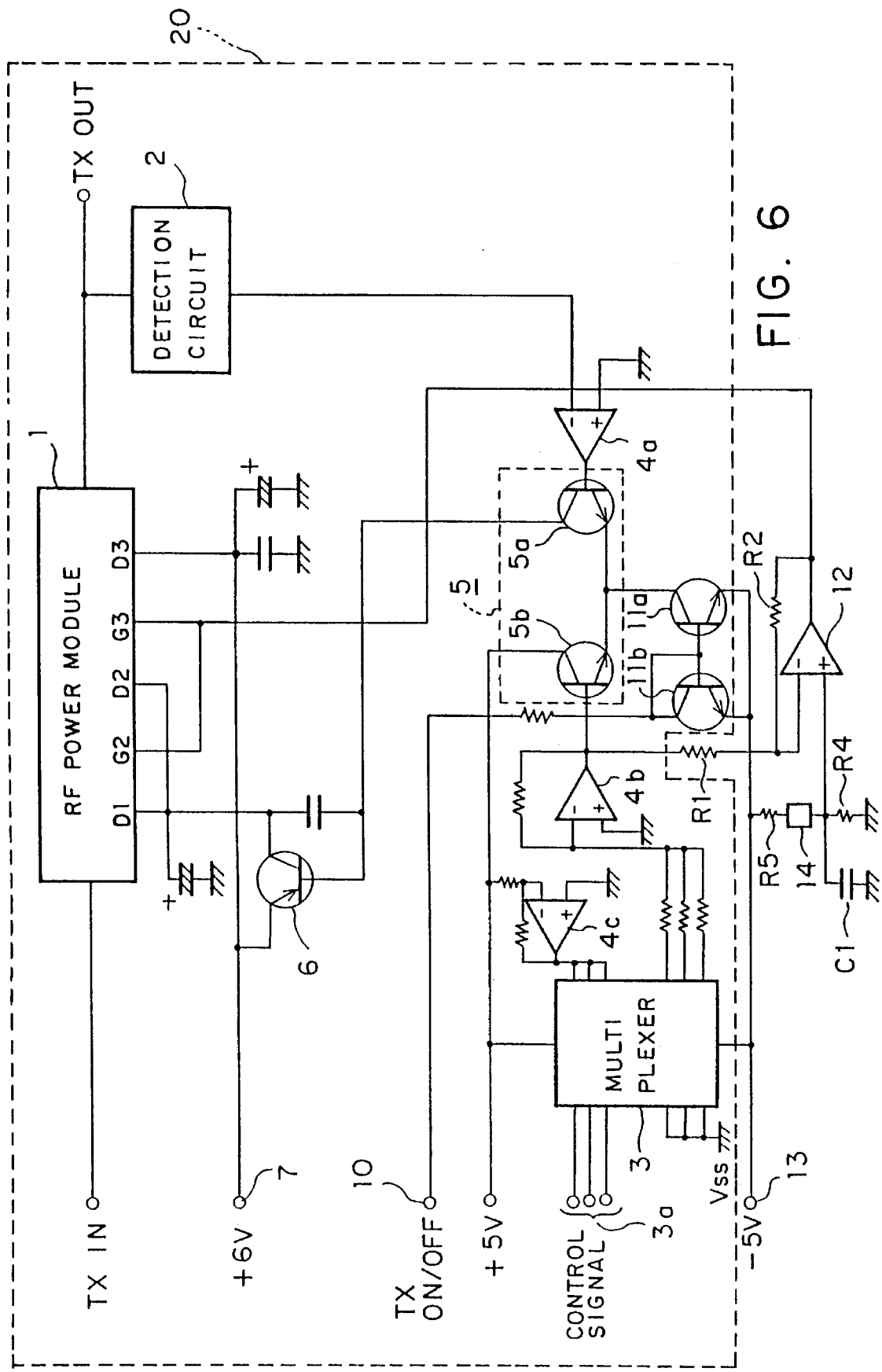
FIG. 6 is a circuit diagram showing a transmission power control circuit as another embodiment of the present invention.

In FIG. 5 and FIG. 6 as hereinafter described, the part surrounded by broken line 20 has the same circuit constitution as that in the transmission power control circuit of the prior art shown in FIG. 1.

The operation of the circuit of FIG. 5 will now be described. The description shall be omitted regarding parts performing the same operation as that shown in FIG. 1. In this embodiment, the operational amplifier 12 uses an output control signal of six steps outputted by the DC amplifier 4b in response to the control signal 3a of the multiplexer 3. In other words, voltage supplied from the negative power source from terminal 13 is controlled based on the output control signal of multiplexer 3, thereby the gate bias voltage supplied to the RF power module 1 is set to the optimum value and the consumption current in the RF power module 1 can be optimized and the efficiency can be improved.

The optimum output of the operational amplifier 12 is obtained as hereinafter described, and the resistance values of the resistors R1–R4 are set in accordance with the obtained result.

First, the drain voltage of the FET is used as parameter, and characteristics of output versus efficiency or output versus drain current using gate voltage as variable are determined corresponding to each parameter. Next, depending on the determined characteristics, the optimum combination of the drain voltage and the gate voltage to each output setting of the six steps of control signal 3a is obtained. The values of the resistors connected to the output terminals of the multiplexer 3 and the resistors R1–R4 which determine the output level of the operational amplifier 12, are determined in order to realize the optimum combinations. Thus the gate bias voltage supplied to the RF power module 1 can be set to a value to improve the efficiency of the RF power module 1.

As a modification of the embodiment, as shown in FIG. 6, a thermistor 14 may be inserted in series to a resistor R5 connected to the line of the negative power source from terminal 13 to be inputted to the operational amplifier 12, thereby variation of the temperature detection value can be compensated and the constitution is even more effective.

In the above-mentioned embodiments, although the operational amplifier 12 and the resistors R1–R4 are used as a gate bias voltage control circuit, the multiplexer 3 and the DC amplifier 4b are used as an output control signal generator of a six-step control, and the differential amplifier 5 is used as means for controlling voltage to be supplied to the drain of the RF power module 1. These circuit elements may be replaced by a microcomputer circuit 3, an analog-digital converter 24 and a digital-analog converter 23 as shown in FIG. 7, and the programming can be performed so that the above-mentioned optimum drain voltage setting value and the gate bias voltage value may be outputted by the microcomputer in response to the control signals 3a.

Figure 7:
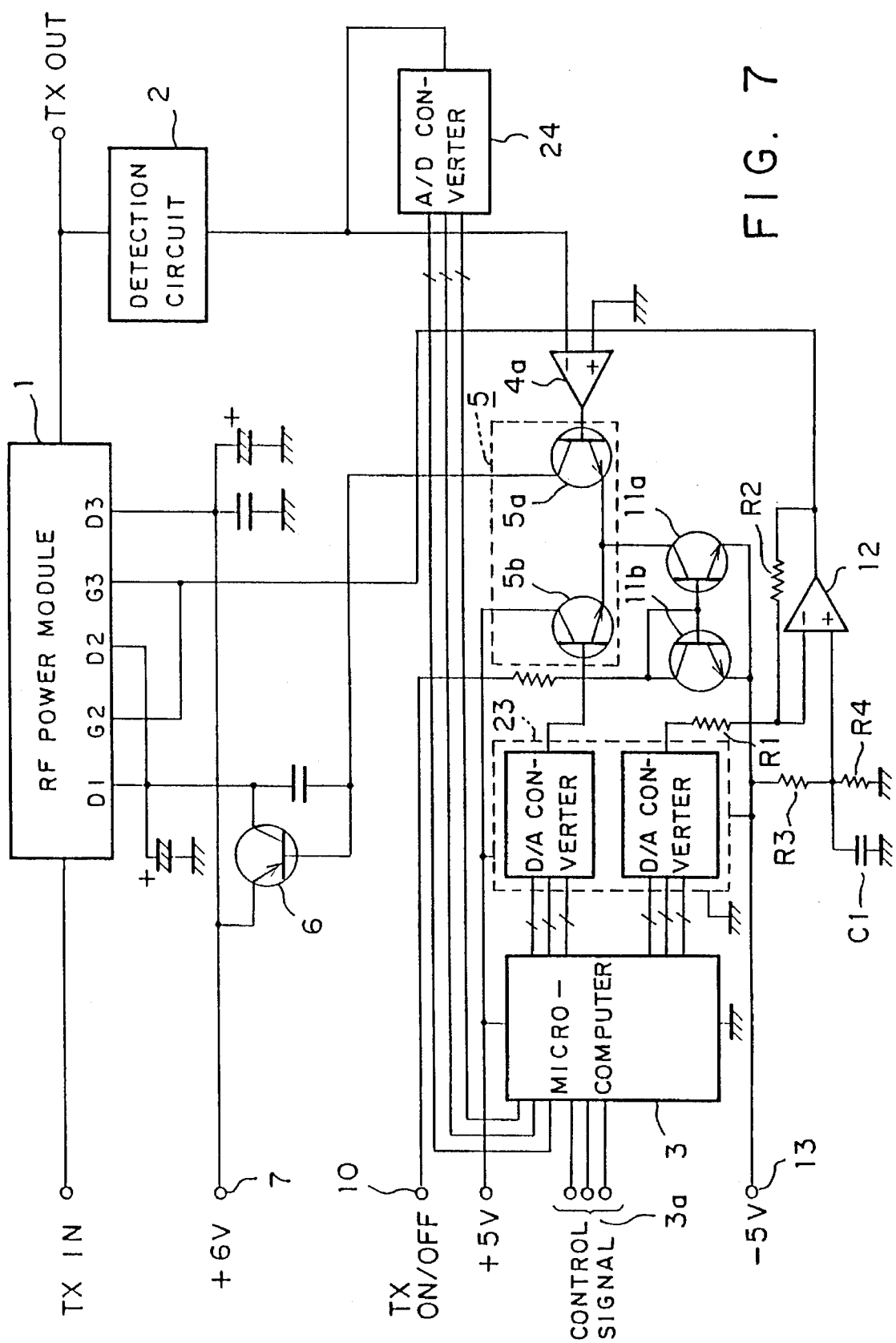
FIG. 7 is a circuit diagram showing a transmission power control circuit as yet another embodiment of the present invention.
Figure 8:
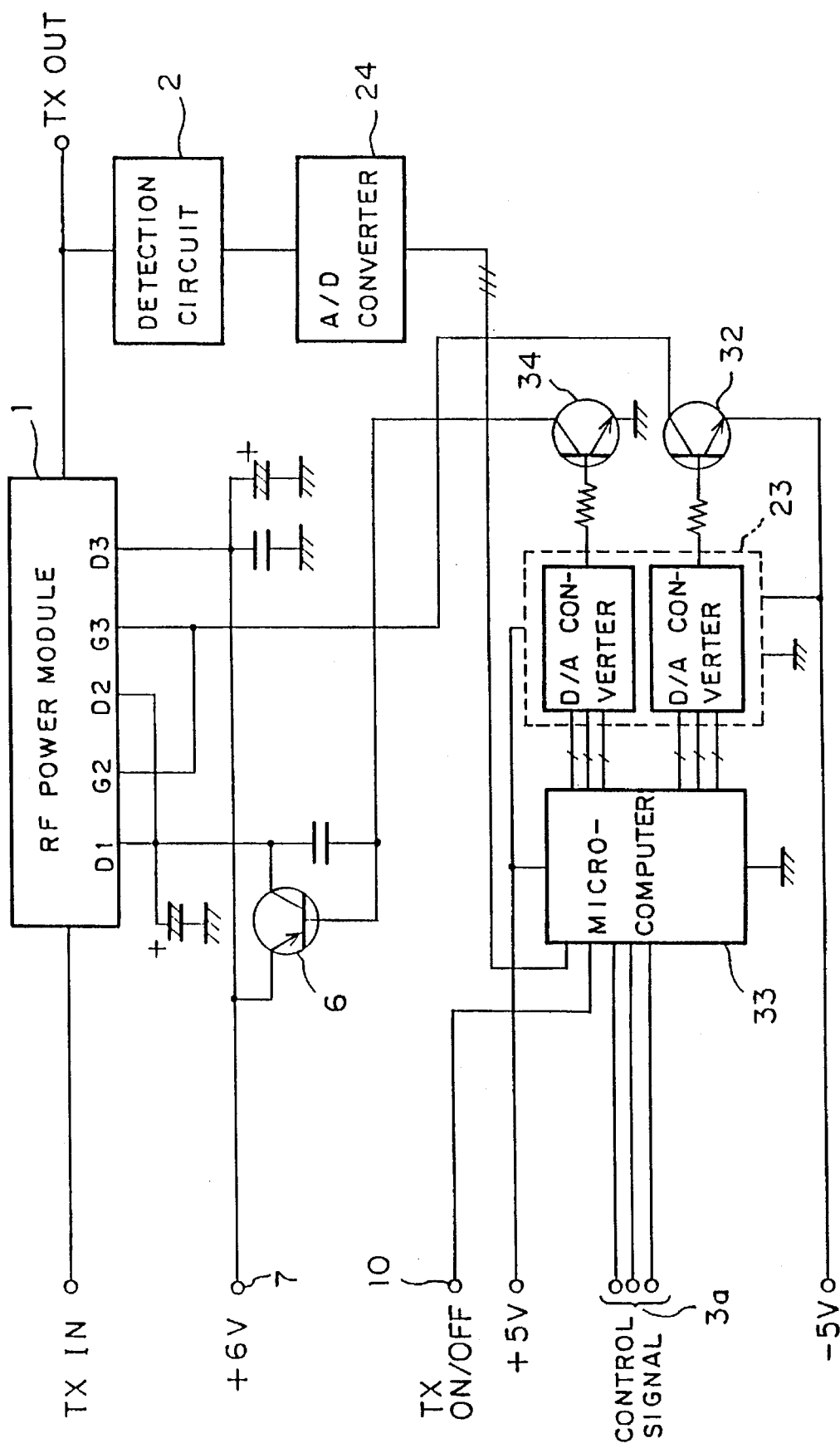
FIG. 8 is a circuit diagram showing a transmission power control circuit as further embodiment of the present invention.

To implement the above mentioned programming, further modification of the embodiment is shown in FIG. 8, the microcomputer has the functions of the differential amplifier 5 and the transmission ON/OFF control transistors 11a and 11b shown in FIG. 7. Amplifiers 32 and 34 are provided to control the gate voltage and drain voltage of the FETs in the power module 1, respectively.

What is claimed is:

1. A transmission power control circuit, comprising:

a RF power module including means for amplifying a communication transmission signal;

RF power module control means, connected to said RF power module, for controlling said RF module in response to a control signal to cause said transmission signal to be amplified to one of a plurality of predetermined levels, said RF module control means comprises a detector circuit for detecting a power level of a transmission signal output by said RF power module and producing a detection signal representative thereof;

differential amplifier means, having inputs connected to said detector circuit and said RF module control means, responsive to said control signal and said detection signal for producing a differential signal at an output thereof; and power control switch means, connected to an output of said differential amplifier means, responsive to said differential signal for switching the power voltage supplied to said RF module for varying the amplification of said transmission signal;

said RF module control means further comprises multiplexer means responsive to said control signal for producing a multiplex signal as a control signal to said differential amplifier means; and bias voltage control means which outputs a bias voltage to perform level setting of stepwise control, connected to said RF power module and said RF power module control means, responsive to a signal from the RF module control means for controlling the bias voltage supplied to said RF power module in accordance with said predetermined level selected by said control signal, so as to achieve optimum power consumption efficiency for the plurality of predetermined levels, wherein said bias voltage control means comprises operational amplifier means responsive to said multiplex signal for controlling said bias voltage supplied to said RF power module.

2. A transmission power control circuit as defined in claim 1, wherein said operational amplifier means comprises an operational amplifier having an non-inverting input terminal connected to a reference voltage, a inverting input terminal connected to said multiplex signal, and an output terminal connected to said RF power module to supply said bias voltage thereto.

3. A transmission power control circuit as defined in claim 2, further including a thermistor in circuit with said non-inverting input terminal to control said bias voltage supply in response to detected ambient temperature conditions.

4. A transmission power control circuit, comprising:

a RF power module including means for amplifying a communication transmission signal;

RF power module control means, connected to said RF power module, for controlling said RF module in response to a control signal to cause said transmission signal to be amplified to one of a plurality of determined levels;

detector means, connected to said RF power module, for detecting a power level of a transmission signal output from said RF power module and producing an analogue detection signal representative thereof;

bias voltage control means which outputs a bias voltage to perform level setting of stepwise control, connected to said RF power module and said RF power module control means, responsive to a signal from the RF module control means for controlling the bias voltage supplied to said RF power module in accordance with a predetermined level selected by an analogue control signal, so as to achieve optimum power consumption efficiency for the plurality of predetermined levels;

microcomputer means for controlling said RF power module in response to a control signal representing one of a predetermined number of power levels up to which said communication signals are amplified; and controlling a bias voltage supplied to said RF power module according to the predetermined power level represented by said control signal so as to achieve a substantially constant power consumption efficiency over the entire range of said predetermined number of power levels;

analogue-to-digital converter means, connected to said detector means and said microcomputer means, for converting said analogue detection signal to a digital signal and supplying it to said microcomputer means; and digital-to-analogue converter means, connected to said microcomputer means, for converting digital control signal(s) from said microcomputer means to said analogue control signal(s) and supplying it (them) to said bias voltage control means.

5. A transmission power control circuit as claimed in claim 4, wherein said RF power module is a single gate RF module.

6. A transmission power control circuit as claimed in claim 4, wherein said bias voltage control means is directly connected to a gate of said RF power module.

7. A transmission power control circuit for a mobile communication transceiver, comprising:

a RF power module including FET transistor means for amplifying a communication transmission signal;

RF power module control means, connected to said RF power module, for controlling the gain of the RF module by applying a control signal to a drain(s) of the FET transistor means to cause said transmission signal to be amplified to one of a plurality of predetermined levels; and bias voltage control means which outputs a bias voltage to perform level setting of stepwise control, connected to a gate(s) electrode of said RF power module and to said RF power module control means, responsive to a signal from the RF module control means for controlling the bias voltage supplied to a gate(s) electrode of the RF power module in accordance with said predetermined level selected by said control signal, so as to achieve optimum power consumption efficiency over the plurality of predetermined levels.

8. A transmission power control circuit as defined in claim 7, wherein said RF module control means comprises a detector circuit for detecting a power level of a transmission signal output by said RF power module and producing a detection signal representative thereof;

differential amplifier means, having inputs connected to said detector circuit and said RF module control means, responsive to said control signal and said detection signal for producing a differential signal at an output thereof; and power control switch means, connected to an output of said differential amplifier means, responsive to said differential signal for switching the power voltage supplied to said RF module for varying the amplification of said transmission signal.

9. A transmission power control circuit as defined in claim 8, wherein said RF module control means further comprises multiplexer means responsive to said control signal for producing a multiplex signal as a control signal to said differential amplifier means.

10. A transmissions power control circuit as defined in claim 9, wherein said bias voltage control means comprises operational amplifier means responsive to said multiplex signal for controlling said bias voltage supplied to said RF power module.

11. A transmission power control circuit as defined in claim 10, wherein said operational amplifier means comprises an operational amplifier having a non-inverting input terminal connected to a reference voltage, an inverting input terminal connected to said multiplex signal, and an output terminal connected to said RF power module to supply said bias voltage thereto.

12. A transmission power control circuit as defined in claim 11, further including a thermistor in circuit with said non-inverting input terminal to control said bias voltage supply in response to detected ambient temperature conditions.

13. A transmission power control circuit as claimed in claim 7, wherein said RF power module is a single gate RF module.

14. A transmission power control circuit as claimed in claim 7, wherein said bias voltage control means is directly connected to the gate electrode of said RF power module.

15. A transmission power control circuit, comprising:

a RF power module including means for amplifying a communication transmission signal;

RF power module control means, connected to said RF power module, for controlling said RF module in response to a control signal to cause said transmission signal to be amplified to one of a plurality of predetermined levels; and bias voltage control means which outputs a bias voltage to perform level setting of stepwise control, connected to said RF power module and said RF power module control means, responsive to a signal from the RF module control means for controlling the bias voltage supplied to said RF power module in accordance with said predetermined level selected by said control signal, so as to achieve optimum power consumption efficiency for the plurality of predetermined levels, wherein said bias voltage control means is directly connected to a gate of said RF power module.

* * * * *